A memory device may include a cell array including a plurality of memory cells and a bit line coupled to the plurality of memory cells; a sense amplifier suitable for amplifying a voltage difference between a first line and a second line; and a separation unit suitable for electrically coupling the bit line and the first line, and electrically separating the bit line and the first line during an initial period of an operation of the sense amplifier.

United States Patent
Won

(10) Patent No.: US 9,524,758 B2
(45) Date of Patent: Dec. 20, 2016

(54) MEMORY DEVICE AND OPERATION METHOD THEREOF

(71) Applicant: SK hynix Inc., Gyeonggi-do (KR)

(72) Inventor: Hyung-Sik Won, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/875,364

(22) Filed: Oct. 5, 2015

(65) Prior Publication Data

US 2016/0293228 A1    Oct. 6, 2016

(30) Foreign Application Priority Data

Apr. 6, 2015  (KR) .......................... 10-2015-0048212

(51) Int. Cl.
- G11C 7/00 (2006.01)
- G11C 7/06 (2006.01)
- G11C 7/10 (2006.01)
- G11C 7/12 (2006.01)

(52) U.S. Cl.
CPC . G11C 7/06 (2013.01); G11C 7/10 (2013.01); G11C 7/12 (2013.01)

(58) Field of Classification Search
None
See application file for complete search history.

(56) References Cited

U.S. PATENT DOCUMENTS

| 5,701,268 A * | 12/1997 | Lee ...................... G11C 11/4091 365/190 |
| 2006/0109731 A1* | 5/2006 | Suh ......................... G11C 7/18 365/230.03 |
| 2008/0291762 A1* | 11/2008 | Kajigaya ............. G11C 11/4076 365/203 |
| 2011/0069570 A1* | 3/2011 | Katoch ............... G11C 11/4076 365/207 |

FOREIGN PATENT DOCUMENTS

| KR | 1020090099708 | 9/2009 |
| KR | 1020100069479 | 6/2010 |

* cited by examiner

Primary Examiner — Son Dinh
Assistant Examiner — Uyen B Tran
(74) Attorney, Agent, or Firm — IP & T Group LLP

(57) ABSTRACT

4 Claims, 5 Drawing Sheets

MEMORY DEVICE AND OPERATION METHOD THEREOF

CROSS-REFERENCE TO RELATED APPLICATIONS

The present application claims priority of Korean Patent Application No. 10-2015-0048212, filed on Apr. 6, 2015, which is incorporated herein by reference in its entirety.

BACKGROUND

1. Field

Exemplary embodiments of the present invention relate to a memory device.

2. Description of the Related Art

Memory devices such as DRAM have numerous memory cells, and as integration increases, the number of memory cells also increases. Such memory cells are regularly arranged to form a memory cell array.

The structure of memory devices can be classified into a folded bit line structure and an open bit line structure, and these structures have the following differences.

A bit line sense amplifier amplifies a voltage difference between a driving bit line, by which data is driven, and a reference bit line serving as a reference. In the folded bit line structure, the driving bit line and the reference bit line are arranged in substantially the same cell array. In the folded bit line structure, since the driving bit line and the reference bit line are arranged in the same cell array, the same noise is reflected on both the driving bit line and the reference bit line and these noises cancel each other. Through such cancellation, the folded bit line structure is robust to noise. In an open bit line structure, the driving bit line and the reference bit line are in different cell arrays. Accordingly, since noise generated in the driving bit line and the reference bit line is likely different, the open bit line structure is vulnerable to noise compared with the folded bit line structure.

However, the open bit line structure is advantageous in terms how much area it utilizes as compared with the folded bit line structure. In the folded bit line structure, the area of a unit memory cell may be designed to 8 $F^2$, but in the open bit line structure, the area of a unit memory cell may be designed to 6 $F^2$. The area of the unit memory cell is the most important factor in deciding the size (the area) of a memory device. A memory device having the open bit line structure may be designed smaller than a memory device having the folded bit line structure, assuming constant data storage capacity. Since the size (the area) of a memory device is the largest contributor to fabrication cost, most memory devices are designed using the open bit line structure.

FIG. 1 is a configuration diagram of conventional memory device having the open bit line structure.

Referring to FIG. 1, the memory device includes first to third cell arrays 111 to 113, a first sense amplifier array 121, a second sense amplifier array 122, and word line drivers 131 to 136.

Each of the first to third cell arrays 111 to 113 includes a plurality of word lines WL and a plurality of bit lines BL, and includes memory cells at intersection points between the word lines WL and the bit lines BL. The word line drivers 131 to 136 drive the word lines WL of the first to third cell arrays 111 to 113.

The first sense amplifier array 121 includes a plurality of sense amplifiers S/A. Each of the sense amplifiers S/A amplifies a voltage difference between each bit line BL of the first cell array 111 and each bit line BL of the second cell array 112. When the bit line BL of the first cell array 111 is the driving bit line, the bit line BL of the second cell array 112 is the reference bit line. When the bit line BL of the second cell array 112 is the driving bit line, the bit line BL of the first cell array 111 is the reference bit line.

The second sense amplifier array 122 includes a plurality of sense amplifiers S/A, wherein each of the sense amplifiers S/A amplifies a voltage difference between each bit line BL of the second cell array 112 and each bit line BL of the third cell array 113. When the bit line BL of the second cell array 112 is the driving bit line, the bit line BL of the third cell array 113 is the reference bit line. When the bit line BL of the third cell array 113 is the driving bit line, the bit line BL of the second cell array 112 is the reference bit line.

Bit lines BL of the first cell array 111, which are not coupled to the first sense amplifier array 121, and bit lines BL of the third cell array 113, which are not coupled to the second sense amplifier array 122, are not used because they are not amplified by sense amplifiers S/A of the first and second sense amplifier arrays 121 and 122. Even when additional sense amplifier arrays are disposed at an upper end of the first cell array 111 and a lower end of the third cell array 113 to be coupled to the un-coupled bit lines BL of the first and third cell arrays 111 and 113, since there are no reference bit lines for the un-coupled bit lines BL, it is still not possible to use these un-coupled bit lines.

SUMMARY

Various embodiments are directed to a memory device of an open bit line structure that does not waste cell arrays, and an operation method thereof.

In an embodiment, a memory device may include: a cell array including a plurality of memory cells and a bit line coupled to the plurality of memory cells; a sense amplifier suitable for amplifying a voltage difference between a first line and a second line; and a separation unit suitable for electrically coupling the bit line and the first line, and electrically separating the bit line and the first line during an initial period of an operation of the sense amplifier.

The separation unit may electrically separate the bit line and the first line in response to activation of a separation signal, and the separation signal may be activated at a time point at which charge sharing has been completed between a memory cell selected from the plurality of memory cells and the bit line and may be deactivated after a predetermined time passes from an activation time of the sense amplifier.

The memory device may further include a precharge unit suitable for precharging the first line and the second line. The memory device may further include a data input/output unit suitable for controlling electrical coupling between the first and second lines and a data bus.

The bit line may be formed in a first direction, the cell array may be positioned at one side of the sense amplifier on a basis of the first direction, and there may be no cell array at the other side of the sense amplifier on the basis of the first direction.

In another embodiment, an operation method of a memory device may include: activating a word line; performing charge sharing between a memory cell and a bit line, which correspond to the word line, and a first line electrically coupled to the bit line; electrically separating the bit line and the first line from after the charge sharing; and amplifying a voltage difference between the first line and a second line after the electrical separating.

In the operation method of the memory device, the amplifying may include: electrically coupling the bit line and the first line after a predetermined time; deactivating the word line after the electrical coupling of the bit line and the first line; ending the amplifying after the deactivating of the word line; and precharging the first line and the second fine after the ending of the amplifying.

In another embodiment, a memory device may include: first to $N^{th}$ sense amplifier arrays (N is an integral number greater than or equal to 3); and first to $N-1^{th}$ cell arrays positioned between the first to $N^{th}$ sense amplifier arrays, wherein a $K^{th}$ cell array is positioned at a lower end of a $K^{th}$ sense amplifier array (K is an integral number greater than or equal to 1 and less than or equal to N-1), wherein the $N-1^{th}$ cell array comprises a plurality of memory cells and a first bit line coupled to the plurality of memory cells, and wherein the $N^{th}$ sense amplifier array comprises: a first sense amplifier suitable for amplifying a voltage difference between a first line and a second line; and a first separation unit suitable for electrically coupling the first bit line and the first line, and electrically separating the first bit line and the first line during an initial period of an operation of the first sense amplifier.

In another embodiment, a memory device may include: a cell array including a plurality of memory cells and a bit line coupled to the plurality of memory cells; a sense amplifier suitable for amplifying a voltage difference between a first line and a second line, wherein the bit line and the first line are coupled; and a separation unit suitable for electrically separating the bit line and the first line when charge sharing is completed between a memory cell and the bit line.

The separation unit may recover the electrical coupling between the bit line and the first line after the amplification of the voltage difference.

The sense amplifier may be disposed at one or more of uppermost and lowermost ends of the plurality of memory cells.

The plurality of memory cells may comprise a plurality of cell arrays.

In accordance with embodiments of the present invention, it is possible to use all bit lines of cell arrays arranged at an edge while using an open bit line structure.

DETAILED DESCRIPTION

Figure 1:
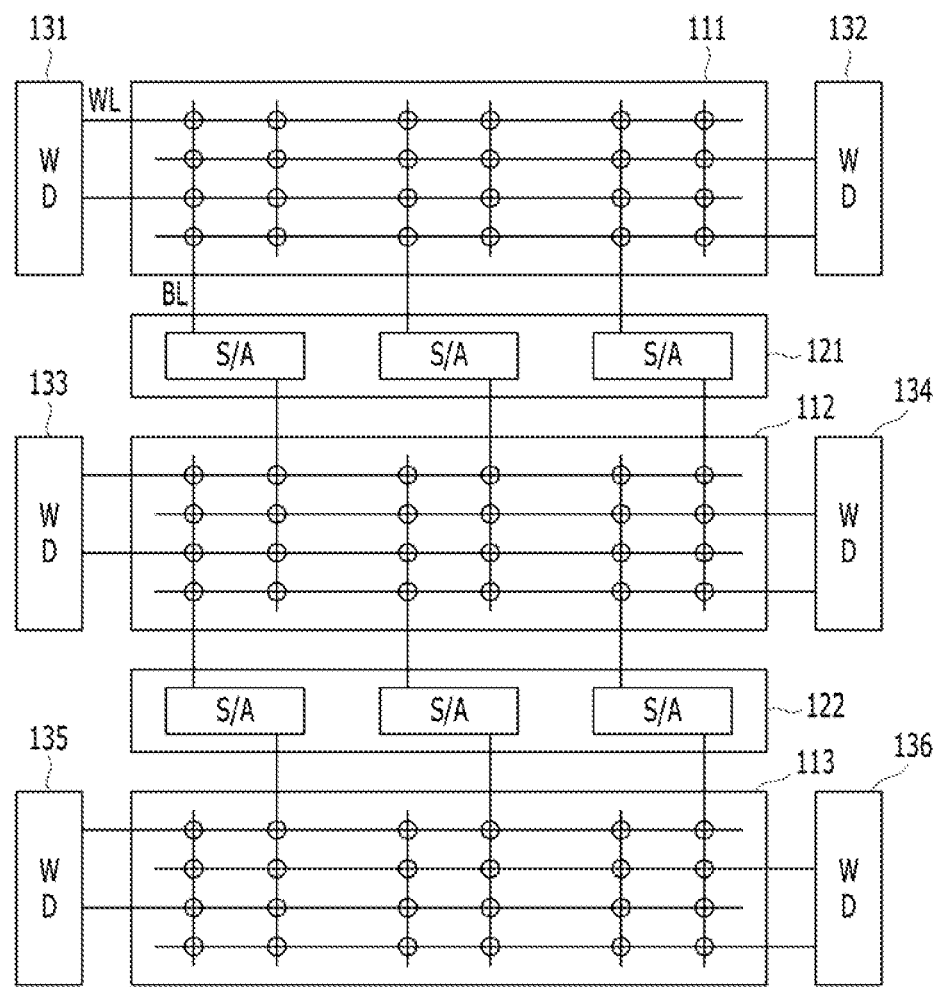
FIG. 1 is a configuration diagram of a conventional memory device having an open bit line structure.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 2:
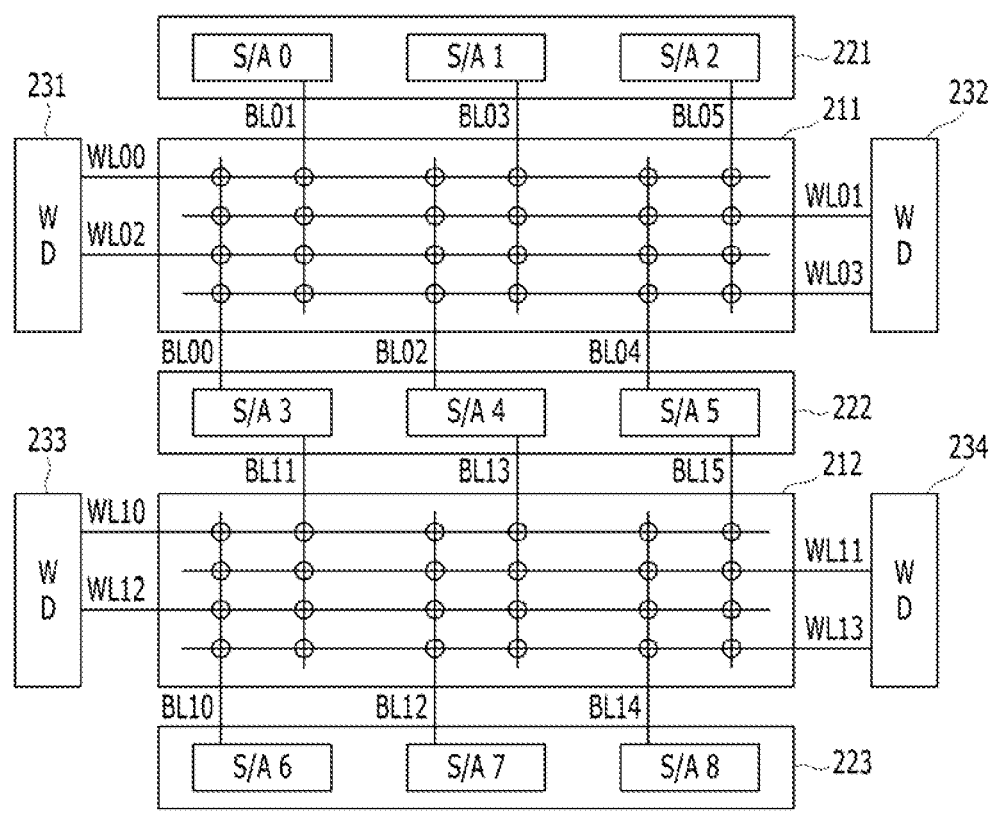
FIG. 2 is a configuration diagram of a memory device in accordance with an embodiment of the present invention.

FIG. 2 is a configuration diagram of a memory device in accordance with an embodiment of the present invention.

Referring to FIG. 2, the memory device may include a first cell array 211, a second cell array 212, first to third sense amplifier arrays 221 to 223, and word line drivers 231 to 234.

The first cell array 211 may include a plurality of word lines WL00 to WL03 and a plurality of bit lines BL00 to BL05. Furthermore, the first cell array 211 may include memory cells positioned at intersection points between the word lines WL00 to WL03 and the bit lines BL00 to BL05. The word line drivers 231 and 232 may drive the word lines WL00 to WL03.

The second cell array 212 may include a plurality of word lines WL10 to WL13 and a plurality of bit lines BL10 to BL15. Furthermore, the second cell array 212 may include memory cells positioned at intersection points between the word lines WL10 to WL13 and the bit lines BL10 to BL15. The word line drivers 233 and 234 may drive the word lines WL10 to WL13.

The second sense amplifier array 222 may include sense amplifiers S/A3 to S/A5. The sense amplifiers S/A3 to S/A5 may amplify data of the bit lines BL00, BL02, BL04, BL11, BL13, and BL15 coupled to the sense amplifiers S/A3 to S/A5. When data is outputted from the first cell array 211, the bit lines BL00, BL02, and BL04 may be the driving bit lines and the bit lines BL11, BL13, and BL15 may be the reference bit lines. When data is outputted from the second cell array 212, the bit lines BL11, BL13, and BL15 may be the driving bit lines and the bit lines BL00, BL02, and BL04 may be the reference bit lines. The second sense amplifier array 222 may be the same as the conventional sense amplifier arrays 121 and 122.

The first sense amplifier array 221 may include sense amplifiers S/A0 to S/A2. The sense amplifiers S/A0 to S/A2 may amplify data of the bit lines BL01, BL03, and BL05 coupled to the sense amplifiers S/A0 to S/A2. The first sense amplifier array 221 may operate without the reference bit lines. That is, when data is outputted from the bit lines BL01, BL03, and BL05 the first sense amplifier array 221 may sense and amplify the data of the bit lines BL01, BL03, and BL05 even without the reference bit lines. Since the first sense amplifier array 221 may sense and amplify the data of the bit lines BL01, BL03, and BL05 even without the reference bit lines, additional cell array do not need to be provided for the reference bit lines for the first sense amplifier array 221, and half of the bit lines in the first cell array 211 may be fully used due to the first sense amplifier array 221 not having the reference bit lines, which is different from wasting the un-coupled bit lines BL of FIG. 1.

The third sense amplifier array 223 may include sense amplifiers S/A6 to S/A8. The sense amplifiers S/A6 to S/A8 may amplify data of the bit lines BL10, BL12, and BL14 coupled to the sense amplifiers S/A6 to S/A8. The third sense amplifier array 223 may operate without the reference bit lines. That is, when data is outputted from the bit lines BL10, BL12, and BL14, the third sense amplifier array 223 may sense and amplify the data of the bit lines BL10, BL12, and BL14 even without the reference bit lines. Since the third sense amplifier array 223 may sense and amplify the data of the bit lines BL10, BL12, and BL14 even without the reference bit lines, additional cell arrays do not need to be provided for the reference bit lines for the third sense amplifier array 223, and half of the bit lines are not wasted due to the first sense amplifier array 221 without the reference bit lines, which is different from wasting the uncoupled bit lines BL of FIG. 1.

FIG. 2 illustrates an example in which each of the cell arrays 211 and 212 includes the four word lines and the six bit lines. However, this is for illustrative purposes only, and each of the cell arrays 211 and 212 may include several hundred word lines and several hundred bit lines. Furthermore FIG. 2 illustrates an example in which the memory device includes the two cell arrays 211 and 212 and the three sense amplifier arrays 221 to 223, but the memory device may include N (N is an integral greater than or equal to 3) sense amplifier arrays and N−1 cell arrays. In this case, among the N sense amplifier arrays, the uppermost sense amplifier array and the lowermost sense amplifier array may operate without the reference bit lines similarly to the first and third sense amplifier arrays 221 and 223, respectively.

Figure 3:
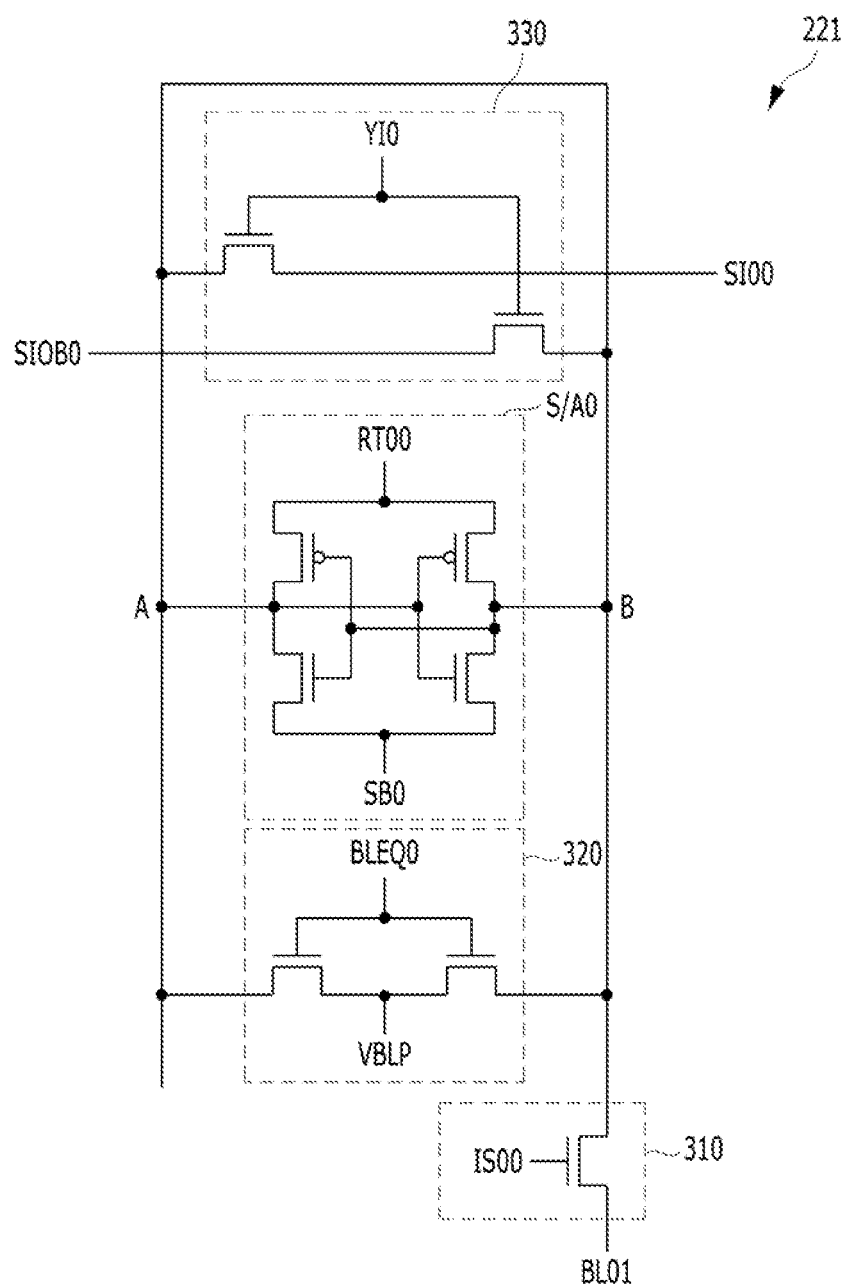
FIG. 3 is a diagram illustrating an embodiment of a sense amplifier in a first sense amplifier array of FIG. 2 and configurations associated therewith.

FIG. 3 is a diagram illustrating an embodiment of the sense amplifier S/A0 in the first sense amplifier array 221 of FIG. 2 and configurations associated with the sense amplifier S/A0.

Referring to FIG. 3, the first sense amplifier array 221 may include the sense amplifier S/A0, a separation unit 310, a precharge unit 320, and a data input/output unit 330.

The sense amplifier S/A0 may amplify a voltage difference between a line A and a line B. The sense amplifier S/A0 may be activated/deactivated by signals RTO0 and SB0. When the signals RTO0 and SB0 have a level of a precharge voltage VBLP, the sense amplifier S/A0 may be deactivated. When the signal RTO0 has a high level and the signal SB0 has a low level, the sense amplifier S/A0 may be activated to amplify the voltage difference between the line A and the line B.

The precharge unit 320 may precharge the line A and the line B to substantially the same voltage level, that is the precharge voltage VBLP, in response to a bit line precharge signal BLEQ0.

The data input/output unit 330 may transfer data of the lines A and B to data buses SIO0 and SIOB0, and may transfer data of the data buses SIO0 and SIOB0 to the lines A and B at the time of activation of a selection signal YI0.

The separation unit 310 may electrically connect the line B and a line BL01, and electrically separate the line B and the line BL01 in response to a separation signal ISO0. In detail, the separation unit 310 may electrically separate the line B and the line BL01 during an initial period of the operation of the sense amplifier S/A0, and may electrically connect the line B and the line BL01 during the other periods. The separation unit 310 may allow the line A and the line B to have substantially the same loading during the initial period of the operation of the sense amplifier S/A0, so that the sense amplifier S/A0 may operate even without the reference bit lines, which will be described in more detail with reference to FIG. 5.

Figure 4:
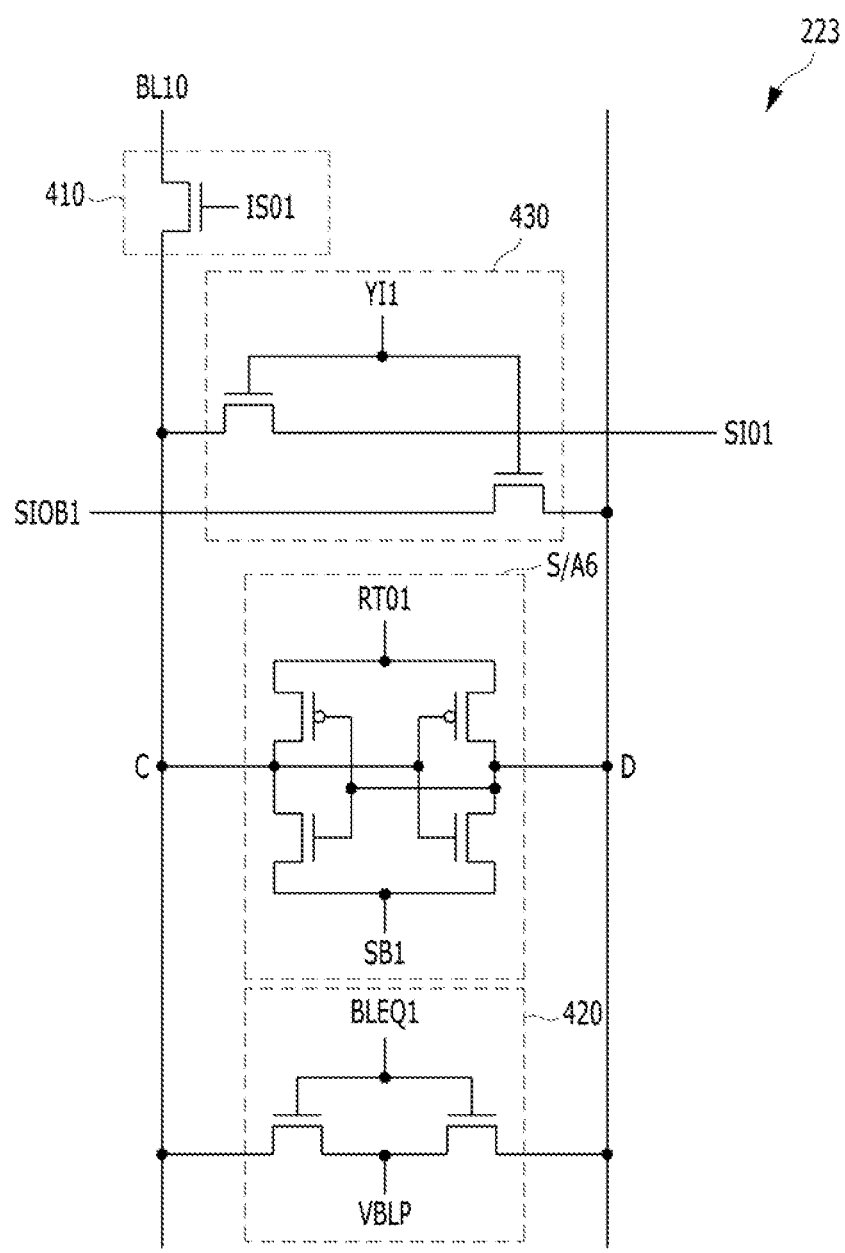
FIG. 4 is a diagram illustrating an embodiment of a sense amplifier in a third sense amplifier array of FIG. 2 and configurations associated therewith.

FIG. 4 is a diagram illustrating an embodiment of the sense amplifier S/A6 in the third sense amplifier array 223 of FIG. 2 and configurations associated with the sense amplifier S/A6.

Referring to FIG. 4, the third sense amplifier array 223 may include the sense amplifier S/A6, a separation unit 410, a precharge unit 420, and a data input/output unit 430.

The sense amplifier S/A6 may amplify a voltage difference between a line C and a line D. The sense amplifier S/A6 may be activated/deactivated by signals RTO1 and SB1. When the signals RTO1 and SB1 have the level of the precharge voltage VBLP, the sense amplifier S/A6 may be deactivated. When the signal RTO1 has a high level and the signal SB1 has a low level, the sense amplifier S/A6 may be activated to amplify the voltage difference between the line C and the line D.

The precharge unit 420 may precharge the line C and the line D to substantially the same voltage level, that is, the level of the precharge voltage VBLP, in response to a bit line precharge signal BLEQ1.

The data input/output unit 430 may transfer data of the lines C and D to data buses SIO1 and SIOB1, and may transfer data of the data buses SIO1 and SIOB1 to the lines C and D at the time of activation of a selection signal YI1.

The separation unit 410 may electrically connect the line C and a line BL10, and electrically separate the line C and the line BL10 in response to a separation signal ISO1. In detail, the separation unit 410 may electrically separate the line C and the line BL10 during an initial period of the operation of the sense amplifier S/A6, and may electrically connect the line C and the line BL10 during the other periods. The separation unit 410 may allow the line C and the line C to have substantially the same loading during the initial period of the operation of the sense amplifier S/A6, so that the sense amplifier S/A6 may operate even without the reference bit lines, which will be described in more detail with reference to FIG. 5.

The second sense amplifier array 222 of FIG. 2 may be the same as the first and third sense amplifier arrays 221 and 223 described with reference to FIGS. 3 and 4 except for the separation unit 310 or 410. Two bit lines may be coupled to each of the sense amplifiers S/A3 to S/A5 of the second sense amplifier array 222, and thus the separation unit 310 or 410 may not be provided to the second sense amplifier array 222.

Figure 5:
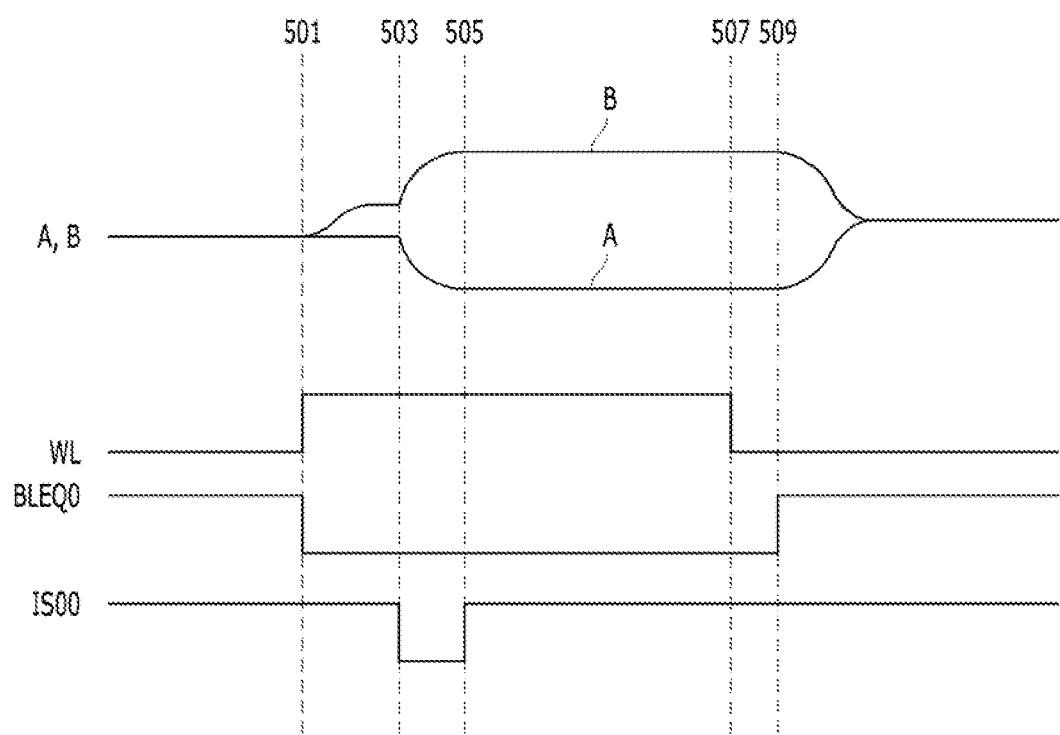
FIG. 5 is a diagram illustrating an operation of a first sense amplifier array of FIG. 3.

FIG. 5 is a diagram illustrating the operation of the first sense amplifier array 221 of FIG. 3, which may be substantially the same as the operation of the third sense amplifier array 223 of FIG. 4.

Referring to FIG. 5, the bit line precharge signal BLEQ0 may stay activated to 'high' until the time point 501. Accordingly, the line A and the line B may be precharged to substantially the same level of the precharge voltage VBLP by the precharge unit 320.

At the time point 501, the bit line precharge signal BLEQ0 may be deactivated to 'low' and the word lines WL00 to WL03 may be activated to 'high'. Accordingly, memory cells and the bit line BL01, which correspond to the activated word line WL, may be subjected to the charge sharing. In this case, since the bit line BL01 and the line B stays electrically connected, the memory cell and the line B may also be subjected to the charge sharing. FIG. 5 shows the voltage level of the line B higher than that of the line A.

At the time point 503 after the charge sharing is completed, the separation signal ISO0 may be activated to 'low'. Accordingly, the bit line BL01 and the line B may be electrically separated. When the bit line BL01 and the line B are electrically separated, the loadings of the line A and the line B may be substantially equal. When the loadings of the line A and the line B are substantially equal, the sense amplifier S/A0 may be activated. FIG. 5 shows the voltage difference between the line A and the line B, which is amplified by the activation of the sense amplifier S/A0. In the related art, the reference bit line is required for the operation of the sense amplifier because it is necessary to have the loadings of lines amplified by the sense amplifier to be substantially equal. However, in embodiments of the is present invention, the line B and the bit line BL01 are electrically separated and thus the loadings of the line A and the line B are adjusted to be substantially equal and then the amplification operation is performed by the sense amplifier S/A0, so that it is possible to perform an exact amplification operation even without the reference bit line.

At the time point 505 at which the voltage difference between the line A and the line B is sufficiently amplified by the sense amplifier S/A0, that is, after the initial operation of the sense amplifier S/A0, the separation signal ISO0 may be deactivated to 'high'. Accordingly, the bit line BL01 and the line B may be electrically connected. Thus, the amplification result of the sense amplifier S/A0 may be transferred to the memory cell again.

At the time point 507, the word line WL may be deactivated to 'low'. Then, at the time point 509 after the word line WL is deactivated, the sense amplifier S/A0 may be deactivated and the bit line precharge signal BLEQ0 may be activated to 'high', and the line A, the line B, and the bit line BL01 may be precharged to the level of the precharge voltage VBLP.

Before the voltage difference between the lines A and B are sufficiently amplified by the sense amplifier S/A0 and the word line WL is deactivated during the time points 505 to 507, data exchange may also be performed between the lines A and B and the data buses SIO0 and SIOB0. In a read operation, data may be transferred from the lines A and B to the data buses SIO0 and SIOB0, and in a write operation, data may be transferred from the data buses SIO0 and SIOB0 to the lines A and B.

The third sense amplifier array 223 may operate similarly to what is shown in FIG. 5, and the second sense amplifier array 222 may also operate similarly to what is shown in FIG. 5, except that the bit line and the sense amplifier are always electrically connected.

Although various embodiments have been described for illustrative purposes, it will be apparent to those skilled in the art that various changes and modifications may be made without departing from the spirit and scope of the invention as defined in the follow claims.

What is claimed is:

1. A memory device comprising:
   first to $N^{th}$ sense amplifier arrays (N is an integral number greater than or equal to 3); and
   first to $N-1^{th}$ cell arrays positioned between the first to $N^{th}$ sense amplifier arrays, wherein a $K^{th}$ cell array is positioned at a lower end of a $K^{th}$ sense amplifier array (K is an integral number greater than or equal to 1 and less than or equal to N−1),
   wherein the $N-1^{th}$ cell array comprises a plurality of memory cells and a first bit line coupled to the plurality of memory cells, and
   wherein the $N^{th}$ sense amplifier array comprises:
   a first sense amplifier suitable for amplifying a voltage difference between a first line and a second line; and
   a first separation unit suitable for electrically coupling the first bit line and the first line, and electrically separating the first bit line and the first line during an initial period of an operation of the first sense amplifier,
   wherein the first cell array comprises a plurality of memory cells and a second bit line coupled to the plurality of memory cells, and
   wherein the first sense amplifier array comprises:
   a second sense amplifier suitable for amplifying a voltage difference between a third line and a fourth line; and
   a second separation unit suitable for electrically coupling the second bit line and the third line, and electrically separating the second bit line and the third line during an initial period of an operation of the second sense amplifier.

2. The memory device of claim 1,
   wherein the first separation unit electrically separates the first bit line and the first line in response to activation of a first separation signal,
   wherein the second separation unit electrically separates the second bit line and the third line in response to activation of a second separation signal,
   wherein the first separation signal is activated when charge sharing has been completed between a memory cell selected from the plurality of memory cells of the $N-1^{th}$ cell array and the first bit line, and is deactivated after a predetermined time passes from activation of the first sense amplifier, and
   wherein the second separation signal is activated when charge sharing has been completed between a memory cell selected from the plurality of memory cells of the first cell array and the second bit line, and is deactivated after a predetermined time passes from activation of the second sense amplifier.

3. The memory device of claim 1,
   wherein the $N^{th}$ sense amplifier array further comprises a first precharge unit suitable for precharging the first line and the second line, and
   wherein the first sense amplifier array further comprises a second precharge unit suitable for precharging the third line and the fourth line.

4. The memory device of claim 3,
   wherein the $N^{th}$ sense amplifier array further comprises a first data input/output unit suitable for controlling electrical coupling between the first and second lines and a first data bus, and
   wherein the first sense amplifier array further comprises a second data input/output unit suitable for controlling electrical coupling between the third and fourth lines and a second data bus.

* * * * *